US009346954B2

(12) United States Patent
Kim et al.

(10) Patent No.: US 9,346,954 B2
(45) Date of Patent: May 24, 2016

(54) CURABLE RESIN COMPOSITION

(71) Applicant: THE YOKOHAMA RUBBER CO., LTD., Minato-Ku, Tokyo (JP)

(72) Inventors: Emi Kim, Hiratsuka (JP); Yoshihito Takei, Hiratsuka (JP); Tsubasa Ito, Hiratsuka (JP); Kazunori Ishikawa, Hiratsuka (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 0 days.

(21) Appl. No.: 14/428,130

(22) PCT Filed: Aug. 26, 2013

(86) PCT No.: PCT/JP2013/072667
§ 371 (c)(1),
(2) Date: Mar. 13, 2015

(87) PCT Pub. No.: WO2014/041994
PCT Pub. Date: Mar. 20, 2014

(65) Prior Publication Data
US 2015/0252191 A1 Sep. 10, 2015

(30) Foreign Application Priority Data

Sep. 14, 2012 (JP) ................. 2012-202767

(51) Int. Cl.
*C08L 83/04* (2006.01)
*H01L 23/29* (2006.01)
*H01L 33/56* (2010.01)
*C08G 77/12* (2006.01)
*C08G 77/20* (2006.01)
*C08G 77/00* (2006.01)

(52) U.S. Cl.
CPC ................. *C08L 83/04* (2013.01); *C08G 77/12* (2013.01); *C08G 77/20* (2013.01); *C08G 77/80* (2013.01); *C08L 2205/025* (2013.01); *H01L 23/296* (2013.01); *H01L 33/56* (2013.01)

(58) Field of Classification Search
None
See application file for complete search history.

(56) References Cited

U.S. PATENT DOCUMENTS

| 6,432,137 | B1 | 8/2002 | Nanushyan et al. | |
| 8,142,895 | B2 | 3/2012 | Khanarian et al. | |
| 8,846,828 | B2* | 9/2014 | Sagawa | C08L 83/04 525/478 |
| 8,937,131 | B2* | 1/2015 | Ko | H01L 33/56 257/791 |
| 2004/0116640 | A1* | 6/2004 | Miyoshi | C08L 83/04 528/12 |
| 2006/0122304 | A1* | 6/2006 | Matayabas | H01L 23/3737 524/430 |
| 2007/0112147 | A1* | 5/2007 | Morita | C08L 83/04 525/478 |
| 2007/0287208 | A1 | 12/2007 | Thompson et al. | |
| 2009/0105395 | A1 | 4/2009 | Kamata et al. | |
| 2009/0236759 | A1* | 9/2009 | Kashiwagi | C08L 83/04 257/791 |
| 2010/0213502 | A1* | 8/2010 | Kashiwagi | C08G 77/20 257/100 |
| 2011/0140289 | A1* | 6/2011 | Shiobara | C08K 3/34 257/789 |
| 2011/0251356 | A1 | 10/2011 | Sagawa et al. | |
| 2014/0194019 | A1* | 7/2014 | Greer | C09J 183/04 442/150 |

FOREIGN PATENT DOCUMENTS

| CN | 101654560 A1 | 2/2010 |
| EP | 2221868 A2 | 8/2010 |
| EP | 2565949 A2 | 3/2013 |
| JP | 11-001619 A | 1/1999 |
| JP | 2008-111117 A | 5/2008 |
| JP | 2009-155442 A | 7/2009 |
| JP | 2009-537992 A | 10/2009 |
| JP | 2010-001336 A | 1/2010 |
| JP | 2011-190366 A | 9/2011 |
| JP | 2011-246680 A | 12/2011 |
| JP | 2013-139547 A | 7/2013 |
| WO | 2008/123252 A1 | 10/2008 |

OTHER PUBLICATIONS

Extended European Search Report issued to the corresponding European Patent Application No. 13837529.0 on Aug. 4, 2015.
Gretton, "A Study of the Scope, Limitations and Kinetics of the Siliconization of Triarylamines Using Tris (pentaflourophenyl) borane Catalysis", thesis submitted to the Department of Engineering & Applied Chemistry at the University of Toronto, 2012.

* cited by examiner

*Primary Examiner* — Marc Zimmer
(74) *Attorney, Agent, or Firm* — Carrier Blackman & Associates, P.C.; Joseph P. Carrier; Anne G. Sabourin

(57) ABSTRACT

The object of the present invention is to provide a curable resin composition having excellent adhesion. This curable resin composition contains: a straight-chain organopolysiloxane (A) having at least two silicon-bonded hydrogen atoms and at least one aryl group in each molecule, the degree of polymerization being greater than 10; a branched-chain organopolysiloxane (B) having at least three alkenyl groups and at least one aryl group in each molecule; and a hydrosilylation reaction catalyst (C).

9 Claims, No Drawings

CURABLE RESIN COMPOSITION

TECHNICAL FIELD

The present invention relates to a curable resin composition.

BACKGROUND

Curable resin compositions containing silicone resins have been known conventionally and are used, for example, as compositions for sealing optical semiconductors.

For example, the following is described in [Claim 1] of Patent Document 1: A curable organopolysiloxane composition comprising at least: (A) a branched-chain organopolysiloxane having in each molecule at least three alkenyl groups, at least 30 mol % of all silicon-bonded organic groups being aryl groups; (B) a straight-chain organopolysiloxane having aryl groups and having both molecular terminals capped with diorganohydrogensiloxy groups; (C) a branched-chain organopolysiloxane having in each molecule at least three diorganohydrogensiloxy groups, at least 15 mol % of all silicon-bonded organic groups being aryl groups . . . ; and (D) a hydrosilylation reaction catalyst . . . .

PRIOR ART DOCUMENT

Patent Document

Patent Document 1: Japanese Unexamined Patent Application Publication No. 2010-1336A

SUMMARY OF THE INVENTION

Problem to be Solved by the Invention

In recent years, the performance level required for curable resin compositions containing silicone resins has increased, and there is a demand for better adhesion to adherends, in particular.

When investigating the "curable organopolysiloxane composition" disclosed in Patent Document 1, the present inventors discovered that the adhesion of the cured product is insufficient.

In addition, in Working Examples 1 and 3 described in the "Working Examples" section of Patent Document 1, a substance with a degree of polymerization of 1 is used as the "(B) straight-chain organopolysiloxane having aryl groups and having both molecular terminals capped with diorganohydrogensiloxy groups" described above.

The present invention was conceived in light of the issues described above, and an object of the present invention is to provide a curable resin composition having excellent adhesion.

Means to Solve the Problem

As a result of conducting dedicated research in order to achieve the object described above, the present inventors discovered that the adhesion of a cured product is excellent when the degree of polymerization of a straight-chain organopolysiloxane having silicon-bonded hydrogen atoms is set to a specific value, and thus completed the present invention.

Specifically, the present invention provides the following (I) to (VI).

(I) A curable resin composition containing: a straight-chain organopolysiloxane (A) having at least two silicon-bonded hydrogen atoms and at least one aryl group in each molecule, the degree of polymerization being greater than 10; a branched-chain organopolysiloxane (B) having at least three alkenyl groups and at least one aryl group in each molecule; and a hydrosilylation reaction catalyst(C).

(II) The curable resin composition according to (I), wherein the degree of polymerization of the straight-chain organopolysiloxane (A) is greater than 30.

(III) The curable resin composition according to (I) or (II), wherein the branched-chain organopolysiloxane (B) is an organopolysiloxane represented by the average unit formula (4) described below.

(IV) The curable resin composition according to any one of (I) to (III), further containing a low-viscosity organopolysiloxane (D) having a viscosity of at most 50,000 mPas at 25° C.

(V) The curable resin composition according to any one of (I) to (IV), further containing a straight-chain organopolysiloxane (G) represented by formula (16) described below.

(VI) The curable resin composition according to any one of (I) to (V), wherein the composition is a composition for sealing an optical semiconductor element.

Effect of the Invention

With the present invention, it is possible to provide a curable resin composition having excellent adhesion.

BEST MODE FOR CARRYING OUT THE INVENTION

The curable resin composition of the present invention (also called the "composition of the present invention" hereafter) is a curable resin composition containing: a straight-chain organopolysiloxane (A) having at least two silicon-bonded hydrogen atoms and at least one aryl group in each molecule, the degree of polymerization being greater than 10; a branched-chain organopolysiloxane (B) having at least three alkenyl groups and at least one aryl group in each molecule; and a hydrosilylation reaction catalyst (C).

Each component contained in the composition of the present invention will be described in detail hereinafter.

<Straight-Chain Organopolysiloxane (A)>

The straight-chain organopolysiloxane (A) is a straight-chain organopolysiloxane having at least two silicon-bonded hydrogen atoms and at least one aryl group in each molecule, the degree of polymerization being greater than 10.

The straight-chain organopolysiloxane (A) is subjected to an addition reaction (hydrosilylation reaction) with respect to the alkenyl groups of the branched-chain organopolysiloxane (B) described below. At this time, since the straight-chain organopolysiloxane (A) has at least two silicon-bonded hydrogen atoms (Si—H), it can function as a crosslinking agent for the branched-chain organopolysiloxane (B).

The composition of the present invention yields excellent adhesion in the cured product since the degree of polymerization of the straight-chain organopolysiloxane (A) is greater than 10. This may be caused by toughness generated in the cured product as a result of containing a polymer component.

From the perspective of demonstrating superior adhesion in the cured product and better handleability, the degree of polymerization of the straight-chain organopolysiloxane (A) is preferably greater than 30, more preferably greater than 30 and at most 1,000, and even more preferably greater than 30 and at most 500.

In this specification, the degree of polymerization of the straight-chain organopolysiloxane is equivalent to a value determined by subtracting the number of the two silicon atoms on both terminals from the number of silicon atoms in the straight-chain organopolysiloxane.

For example, when the straight-chain organopolysiloxane (A) is an organopolysiloxane represented by formula (1) described below, the degree of polymerization is a value expressed by n in formula (1).

In addition, the degree of polymerization of the straight-chain organopolysiloxane (G) represented by formula (16) described below is a value expressed by k in formula (16).

Further, in order to ensure that the resulting cured product has low attenuation due to the diffraction, reflection, scattering, or the like of light, the straight-chain organopolysiloxane (A) has at least one aryl group, and it is preferable for at least 30 mol % and more preferable for at least 40 mol % of all of the silicon-bonded organic groups to be aryl groups.

Examples of these aryl groups include aryl groups having from 6 to 18 carbon atoms such as phenyl groups, tolyl groups, and xylyl groups, and phenyl groups are preferable.

Examples of groups binding to the silicon atoms in the straight-chain organopolysiloxane (A) include substituted or unsubstituted monovalent hydrocarbon groups not having aliphatic unsaturated groups, and specific examples include alkyl groups having from 1 to 18 carbon atoms such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups; aryl groups having from 6 to 18 carbon atoms such as phenyl groups, tolyl groups, and xylyl groups; aralkyl groups having from 7 to 18 carbon atoms such as benzyl groups and phenethyl groups; and halogenated alkyl groups having from 1 to 18 carbon atoms such as 3-chloropropyl groups and 3,3,3-trifluoropropyl groups.

Such a straight-chain organopolysiloxane (A) is preferably a straight-chain organopolysiloxane having both molecular terminals capped with diorganohydrogensiloxy groups, an example of which is an organopolysiloxane represented by the following formula (1).

$$HR^1{}_2SiO(R^1{}_2SiO)_nSiR^1{}_2H \qquad (1)$$

In formula (1), each $R^1$ moiety is independently a substituted or unsubstituted monovalent hydrocarbon group not having aliphatic unsaturated bonds. Examples of the monovalent hydrocarbon group of $R^1$ include alkyl groups having from 1 to 18 carbon atoms such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups; aryl groups having from 6 to 18 carbon atoms such as phenyl groups, tolyl groups, and xylyl groups; aralkyl groups having from 7 to 18 carbon atoms such as benzyl groups and phenethyl groups; and halogenated alkyl groups having from 1 to 18 carbon atoms such as 3-chloropropyl groups and 3,3,3-trifluoropropyl groups. Of these, alkyl groups having from 1 to 18 carbon atoms are preferable, and methyl groups (sometimes referred to as "Me" hereafter) are more preferable.

It is also preferable for least one $R^1$ moiety to be an aryl group and for at least 30 mol % to be aryl groups, and it is more preferable for at least 40 mol % to be aryl groups. The aryl groups are aryl groups having from 6 to 18 carbon atoms and are preferably phenyl groups (sometimes referred to as "Ph" hereafter).

In formula (1), n is a positive number with an average value greater than 10; positive numbers greater than 30 are preferable; positive numbers greater than 30 and at most 1,000 are more preferable; and positive numbers greater than 30 and at most 500 are even more preferable. When n is a positive number of 10 or lower, the adhesion of the cured product is diminished, whereas when n is within the ranges described above, the adhesion of the cured product is excellent.

From the perspective of ensuring that toughness is generated in the cured product, the weight average molecular weight (Mw) of the straight-chain organopolysiloxane (A) is preferably from 500 to 1,000,000 and more preferably from 1,000 to 150,000.

In the present invention, the weight average molecular weight is the weight average molecular weight indicated by the molecular weight of polystyrene as determined by gel permeation chromatography (GPC) using chloroform as a solvent.

In addition, the viscosity of the straight-chain organopolysiloxane (A) at 25° C. is preferably from 20 to 1,000,000 mPas and more preferably from 200 to 100,000 mPa s.

Further, in the present invention, viscosity is measured at 25° C. in accordance with section 4.1 (Brookfield rotational viscometer) of JIS K7117-1.

(Production Method of the Straight-Chain Organopolysiloxane (A))

The production method of the straight-chain organopolysiloxane (A) is not particularly limited, and an example is a method of obtaining the straight-chain organopolysiloxane (A) described above as a main product by reacting an organopolysiloxane (a1) having two or more silanol groups in each molecule and a disiloxane (a2) having silicon-bonded hydrogen atoms, adding water ($H_2O$) as a by-product, and optionally performing dehydration condensation on the silanol groups remaining after the reaction.

At this time, the reaction may be ended after obtaining a reaction product containing the straight-chain organopolysiloxane (A) as a main product and by-products by performing reaction tracking by with $^1$H-NMR and confirming the disappearance of peaks originating from the silanol groups of the organopolysiloxane (a1) or the appearance of peaks originating from components other than the components used in the reaction.

An example of the organopolysiloxane (a1) used in the reaction described above is an organopolysiloxane represented by the following formula (2), and an example of the disiloxane (a2) is a disiloxane represented by the following formula (3).

$$HO(R^1{}_2SiO)_mH \qquad (2)$$

$$HR^1{}_2SiOSiR^1{}_2H \qquad (3)$$

In formulas (2) and (3), $R^1$ is synonymous with $R^1$ described above. In addition, in formula (2), m is a positive number equal to or less than n described above.

In the production method described above, some of the silanol groups of the organopolysiloxane (a1) of formula (2), for example, are capped with —$SiR^1{}_2H$ originating from the disiloxane (a2) of formula (3), and the remaining silanol groups are condensed and thereby polymerized. Therefore, the degree of polymerization of the straight-chain organopolysiloxane (A) depends on the charged amount of the disiloxane (a2).

The compounding ratio of each component in the reaction described above is preferably an amount so that the disiloxane (a2) is from 0.001 to 0.2 mol per 10 mol of the silanol groups in the organopolysiloxane (a1).

The reaction described above is preferably performed by stirring. At the time of stirring, it is preferable to heat the mixture within a temperature range of from 50 to 65° C., for example, and the stirring time (reaction time) is preferably from 1 to 5 hours, for example.

<Branched-Chain Organopolysiloxane (B)>

The branched-chain organopolysiloxane (B) is a branched-chain organopolysiloxane having at least three alkenyl groups and at least one aryl group in each molecule.

Examples of these alkenyl groups include alkenyl groups having from 2 to 18 carbon atoms such as vinyl groups, allyl groups, butenyl groups, pentenyl groups, hexenyl groups, and octenyl groups, and vinyl groups (sometimes referred to as "Vi" hereafter) are preferable.

The amount of alkenyl groups in each molecule is preferably from 2 to 12 mass % and more preferably from 3 to 10 mass %.

In addition, the branched-chain organopolysiloxane (B) preferably has at least one aryl group, and it is preferable for at least 30 mol % and more preferable for at least 40 mol % of all of the silicon-bonded organic groups to be aryl groups.

Examples of these aryl groups include aryl groups having from 6 to 18 carbon atoms such as phenyl groups, tolyl groups, and xylyl groups, and phenyl groups are preferable.

As a result, not only does the resulting cured product have low attenuation due to the diffraction, reflection, scattering, or the like of light, but the substance has excellent compatibility with the straight-chain organopolysiloxane (A), which similarly has aryl groups, reduced turbidity or the like, and excellent transparency of the cured product.

Examples of other groups binding to silicon atoms in the branched-chain organopolysiloxane (B) include substituted or unsubstituted monovalent hydrocarbon groups excluding alkenyl groups and aryl groups, and specific examples include alkyl groups having from 1 to 18 carbon atoms such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups; aralkyl groups having from 7 to 18 carbon atoms such as benzyl groups and phenethyl groups; and halogenated alkyl groups having from 1 to 18 carbon atoms such as 3-chloropropyl groups and 3,3,3-trifluoropropyl groups. The substance may also contain small amounts of other groups such as silicon-bonded hydroxyl groups or silicon-bonded alkoxy groups. Examples of these alkoxy groups include methoxy groups, ethoxy groups, propoxy groups, and butoxy groups.

Such a branched-chain organopolysiloxane (B) is preferably an organopolysiloxane represented by the following average unit formula (4).

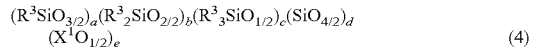
(4)

In formula (4), each $R^3$ moiety is independently a substituted or unsubstituted monovalent hydrocarbon group. Examples of this monovalent hydrocarbon group include alkyl groups having from 1 to 18 carbon atoms such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups; alkenyl groups having from 2 to 18 carbon atoms such as vinyl groups, allyl groups, butenyl groups, pentenyl groups, hexenyl groups, and octenyl groups; aryl groups having from 6 to 18 carbon atoms such as phenyl groups, tolyl groups, and xylyl groups; aralkyl groups having from 7 to 18 carbon atoms such as benzyl groups and phenethyl groups; and halogenated alkyl groups having from 1 to 18 carbon atoms such as 3-chloropropyl groups and 3,3,3-trifluoropropyl groups.

However, it is preferable for at least three of the $R^3$ moieties in each molecule to be alkenyl groups and for the amount of $R^3$ in the form of alkenyl groups to be from 2 to 12 mass %, and the amount is more preferably from 3 to 10 mass %.

In addition, it is also preferable for at least one $R^3$ moiety in each molecule to be an aryl group and for at least 30 mol % of all of the $R^3$ moieties to be aryl groups, and it is more preferable for at least 40 mol % to be aryl groups.

In formula (4), $X^1$ is a hydrogen atom or an alkyl group. Examples of this alkyl group include alkyl groups having from 1 to 18 carbon atoms such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups, and methyl groups are preferable.

In formula (4), a is a positive number; b is 0 or a positive number; c is 0 or a positive number; d is 0 or a positive number; e is 0 or a positive number; b/a is a number within a range of from 0 to 10; c/a is a number within a range of from 0 to 5; d/(a+b+c+d) is a number within a range of from 0 to 0.3; and e/(a+b+c+d) is a number within a range of from 0 to 0.4.

The weight average molecular weight (Mw) of the branched-chain organopolysiloxane (B) is preferably from 1,000 to 300,000 and more preferably from 1,000 to 100,000.

The branched-chain organopolysiloxane (B) is an extremely viscous semi-solid material or a solid material, and the viscosity thereof is difficult to measure.

The content of the branched-chain organopolysiloxane (B) is preferably an amount at which the molar ratio of the silicon-bonded hydrogen atoms of the straight-chain organopolysiloxane (A) having silicon-bonded hydrogen atoms (when the composition of the present invention also contains an organopolysiloxane having silicon-bonded hydrogen atoms (for example, a straight-chain organopolysiloxane (G) described below), this organopolysiloxane is also included; this is the same hereafter) and the alkenyl groups of the branched-chain organopolysiloxane (B) (also called the "Si—H/Si-Vi molar ratio" hereafter for the sake of convenience) satisfies a range of from 0.5 to 5.0, more preferably a range of from 0.1 to 2.0, and even more preferably a range of from 0.5 to 1.5.

When the Si—H/Si-Vi molar ratio is within this range, the curability of the composition of the present invention is excellent, and the adhesion of the cured product is also superior.

<Hydrosilylation Reaction Catalyst (C)>

The hydrosilylation reaction catalyst (C) contained in the composition of the present invention is used in combination with the straight-chain organopolysiloxane (A) and functions as a catalyst for accelerating the addition reaction (hydrosilylation reaction) with respect to the alkenyl groups of the branched-chain organopolysiloxane (B).

A conventionally known catalyst can be used as the hydrosilylation reaction catalyst (C). Examples include platinum catalysts, rhodium catalysts, and palladium catalysts, and platinum catalysts are preferable. Specific examples of platinum catalysts include chloroplatinic acid, chloroplatinic acid-olefin complexes, chloroplatinic acid-divinyltetramethyldisiloxane complexes, chloroplatinic acid-alcohol coordination compounds, diketone complexes, and platinum divinyltetramethyldisiloxane complexes. One type of these catalysts may be used alone, or two or more types may be used in combination.

The content of the hydrosilylation reaction catalyst (C) is a catalytic amount, but from the perspective of ensuring the excellent curability of the composition of the present invention, the content is preferably from 0.00001 to 0.1 parts by mass and more preferably from 0.0001 to 0.01 parts by mass per total of 100 parts by mass of the straight-chain organopolysiloxane (A) and the branched-chain organopolysiloxane (B) described above.

<Low-Viscosity Organopolysiloxane (D)>

The composition of the present invention preferably contains a low-viscosity organopolysiloxane (D) having a viscosity of at most 50,000 mPas at 25° C. The adhesion of the cured product is superior as a result of containing the low-viscosity organopolysiloxane (D). This may be due to the fact that reducing the viscosity provides flexibility, which suppresses the occurrence of cracking and the like.

From the perspective of further improving the adhesion of the cured product, the viscosity of the low-viscosity organopolysiloxane (D) at 25° C. is preferably from 1,000 to 30,000 mPas.

The low-viscosity organopolysiloxane (D) is not particularly limited as long as it is an organopolysiloxane having a viscosity of at most 50,000 mPas at 25° C., but it is preferably a branched-chain organopolysiloxane having at least three alkenyl groups in each molecule.

A specific example of such a low-viscosity organopolysiloxane (D) is an organopolysiloxane represented by the following average unit formula (5).

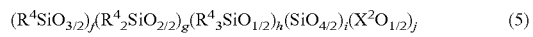

$$(R^4SiO_{3/2})_f(R^4{}_2SiO_{2/2})_g(R^4{}_3SiO_{1/2})_h(SiO_{4/2})_i(X^2O_{1/2})_j \quad (5)$$

In formula (5), each $R^4$ moiety is independently a substituted or unsubstituted monovalent hydrocarbon group. Examples of this monovalent hydrocarbon group include alkyl groups having from 1 to 18 carbon atoms such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups; alkenyl groups having from 2 to 18 carbon atoms such as vinyl groups, allyl groups, butenyl groups, pentenyl groups, hexenyl groups, and octenyl groups; aryl groups having from 6 to 18 carbon atoms such as phenyl groups, tolyl groups, and xylyl groups; aralkyl groups having from 7 to 18 carbon atoms such as benzyl groups and phenethyl groups; and halogenated alkyl groups having from 1 to 18 carbon atoms such as 3-chloropropyl groups and 3,3,3-trifluoropropyl groups.

However, it is preferable for at least three of the $R^4$ moieties in each molecule to be alkenyl groups. In addition, it is also preferable for at least 10 mol % of all of the $R^4$ moieties in each molecule to be aryl groups.

In formula (5), $X^2$ is a hydrogen atom or an alkyl group. Examples of this alkyl group include alkyl groups having from 1 to 18 carbon atoms such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups, and methyl groups are preferable.

In formula (5), f is a positive number; g is 0 or a positive number; h is 0 or a positive number; i is 0 or a positive number; j is 0 or a positive number; g/f is a number within a range of from 0 to 10; h/f is a number within a range of from 0 to 0.5; i/(f+g+h+i) is a number within a range of from 0 to 0.3; and j/(f+g+h+i) is a number within a range of from 0 to 0.4.

The weight average molecular weight (Mw) of the low-viscosity organopolysiloxane (D) is preferably from 500 to 50,000 and more preferably from 1,000 to 30,000.

In addition, the content of the low-viscosity organopolysiloxane (D) is not particularly limited but is preferably from 5 to 50 parts by mass and more preferably from 10 to 30 parts by mass per total of 100 parts by mass of the straight-chain organopolysiloxane (A) and the branched-chain organopolysiloxane (B) described above.

<Curing Retarder (E)>

The composition of the present invention may further contain a curing retarder (E). The curing retarder (E) is a component for adjusting the curing speed or the working life of the composition of the present invention, and examples include alcohol derivatives containing carbon-carbon triple bonds such as 3-methyl-1-butyn-3-ol, 3,5-dimethyl-1-hexyn-3-ol, phenylbutynol, and 1-ethynyl-1-cyclohexanol; enyne compounds such as 3-methyl-3-pentene-1-yne and 3,5-dimethyl-3-hexene-1-yne; alkenyl group containing low molecular weight siloxanes such as tetramethyltetravinylcyclotetrasiloxane and tetramethyltetrahexenylcyclotetrasiloxane; and alkyne-containing silanes such as methyl-tris(3-methyl-1-butyn-3-oxy)silane and vinyl-tris(3-methyl-1-butyn-3-oxy)silane. One type of these retarders may be used alone, or two or more types may be used in combination.

The content of the curing retarder (E) is selected appropriately in accordance with the usage method or the like of the composition of the present invention but is, for example, preferably from 0.00001 to 0.1 parts by mass and more preferably from 0.0001 to 0.01 parts by mass per total of 100 parts by mass of the straight-chain organopolysiloxane (A) and the branched-chain organopolysiloxane (B) described above.

<Adhesion Imparting Agent (F)>

The composition of the present invention may further contain an adhesion imparting agent (F).

An example of the adhesion imparting agent is a silane coupling agent. Specific examples of silane coupling agents include aminosilanes, vinyl silanes, epoxy silanes, methacrylic silanes, isocyanate silanes, iminosilanes, reaction products thereof, and compounds obtained by reactions between these substances and polyisocyanate, and epoxy silanes are preferable.

The epoxy silane is not particularly limited as long as it is a compound having an epoxy group and an alkoxysilyl group, and examples include dialkoxyepoxysilanes such as γ-glycidoxypropyl methyl dimethoxysilane, γ-glycidoxypropyl ethyl diethoxysilane, γ-glycidoxypropyl methyl diethoxysilane, and β-(3,4-epoxycyclohexyl)ethylmethyldimethoxysilane; and trialkoxyepoxysilanes such as γ-glycidoxypropyl trimethoxysilane and β-(3,4-epoxycyclohexyl)ethyltrimethoxysilane.

In addition, the adhesion imparting agent (F) may be a dehydration condensation product of the epoxy silane described above, examples of which include epoxy silane dehydration condensation productions formed by performing dehydration condensation on γ-glycidoxypropyl trimethoxysilane, phenyltrimethoxysilane, and 1,3-divinyl-1,1,3,3-tetramethyldisiloxane.

The content of the adhesion imparting agent (F) is not particularly limited but is preferably from 0.5 to 10 parts by mass and more preferably from 1 to 5 parts by mass per total of 100 parts by mass of the straight-chain organopolysiloxane (A) and the branched-chain organopolysiloxane (B) described above.

<Straight-Chain Organopolysiloxane (G)>

The composition of the present invention may further contain, separate from the straight-chain organopolysiloxane (A) described above, a straight-chain organopolysiloxane (G) represented by the following formula (16).

$$HR^2_2SiO(R^2_2SiO)_k SiR^2_2H \tag{16}$$

In formula (16), each $R^2$ moiety is independently an alkyl group, an aryl group, a hydroxy group (—OH), or an alkoxy group, and at least one of the $R^2$ moieties is an aryl group.

Examples of the alkyl groups of $R^2$ include alkyl groups having from 1 to 18 carbon atoms such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups, and methyl groups are preferable.

Examples of the aryl groups of $R^2$ include aryl groups having from 6 to 18 carbon atoms such as phenyl groups, tolyl groups, and xylyl groups, and phenyl groups are preferable.

Examples of the alkoxy groups of $R^2$ include methoxy groups, ethoxy groups, propoxy groups, and butoxy groups, and methoxy groups are preferable.

In formula (16), k is a positive number from 1 to 5 as an average value, and a positive number from 1 to 3 is preferable.

The foldability of the composition of the present invention can be improved by containing a straight-chain organopolysiloxane (G) having a degree of polymerization of from 1 to 5. This may be due to the fact that the structure of the composition of the present invention does not become too dense.

From the perspective of ensuring that the foldability can be better improved, an organopolysiloxane represented by the following formula (17) is preferable as the straight-chain organopolysiloxane (G).

$$HMe_2SiO(Ph_2SiO)_k SiMe_2H \tag{17}$$

In formula (17), k is synonymous with k described above.

The content of the straight-chain organopolysiloxane (G) is not particularly limited but is preferably an amount at which the "Si—H/Si-Vi molar ratio" described above is within the range described above.

The production method of the composition of the present invention is not particularly limited, and an example is a method of producing the composition by mixing the essential components and optional components described above.

In addition, the method of obtaining a cured product by curing the composition of the present invention is also not particularly limited, and an example is a method of heating the composition of the present invention for 10 to 720 minutes at 80 to 200° C.

The composition of the present invention may be used as an adhesive, a primer, a sealant, or the like in fields such as, for example, display materials, optical recording media materials, optical device materials, optical part materials, optical fiber materials, optical-electronic function organic materials, and semiconductor circuit peripheral materials.

In particular, the composition of the present invention can be suitably used as a sealing material for an optical semiconductor since it has excellent adhesion and the cured product thereof demonstrates good transparency and a high refractive index.

The optical semiconductors to which the composition of the present invention can be applied are not particularly limited, and examples include light-emitting diodes (LED), organic electroluminescent elements (organic EL), laser diodes, and LED arrays.

Examples of methods of use of the composition of the present invention include applying the composition of the present invention to an optical semiconductor, heating the optical semiconductor to which the composition of the present invention has been applied, and curing the composition of the present invention.

At this time, the method of applying and curing the composition of the present invention is not particularly limited, and examples include a method using a dispenser, a potting method, screen printing, transfer molding, and injection molding.

EXAMPLES

The present invention will be described in detail hereinafter using working examples, but the present invention is not limited to these examples.

<Production of Si—H Organopolysiloxanes>

(Straight-Chain Organopolysiloxane A1)

First, 100 g of a straight-chain organopolysiloxane having a silanol group represented by the following formula (6), 1 g of 1,1,3,3-tetramethyldisiloxane, and 0.1 g of trifluoromethanesulfonic acid were charged into a flask with a stirrer and a reflux cooling tube, and the mixture was stirred and heated for two hours at 50° C. Next, 150 g of toluene was added, and the water that was produced was discharged to the outside of the system. After the toluene layer was washed with water three times, the layer was concentrated under reduced pressure to obtain a straight-chain organopolysiloxane A1 represented by the following formula (7).

$$HO(MePhSiO)_6 H \tag{6}$$

$$HMe_2SiO(MePhSiO)_{100} SiMe_2H \tag{7}$$

(Straight-Chain Organopolysiloxane A2)

A straight-chain organopolysiloxane A2 represented by the following formula (8) was obtained in the same manner as described above with the exception of changing the charged amount of 1,1,3,3-tetramethyldisiloxane to 1.5 g.

$$HMe_2SiO(MePhSiO)_{60} SiMe_2H \tag{8}$$

(Straight-Chain Organopolysiloxane A3)

A straight-chain organopolysiloxane A3 represented by the following formula (9) was obtained in the same manner as described above with the exception of changing the charged amount of 1,1,3,3-tetramethyldisiloxane to 3 g.

(Straight-Chain Organopolysiloxane G1)

First, 100 g of dichlorodiphenylsilane and 107 g of chlorodimethylsilane ($HMe_2SiCl$) were charged into a flask with a stirrer and a reflux cooling tube, and 30 g of water was dropped into the solution while stirring over the course of one hour. After dropping was complete, the solution was heat-refluxed for five hours at 50° C. After the solution was cooled to room temperature, toluene was added, mixed, and left to stand. The bottom layer (water layer) was separated, and the toluene solution layer was washed with water three times. The remaining toluene solution layer was concentrated under reduced pressure to obtain a straight-chain organopolysiloxane G1 represented by the following formula (10).

$$HMe_2SiO(Ph_2SiO)SiMe_2H \tag{10}$$

(Straight-Chain Organopolysiloxane G2)

First, 100 g of dichlorodiphenylsilane and 53.5 g of chlorodimethylsilane were charged into a flask with a stirrer and a reflux cooling tube, and 30 g of water was dropped into the solution while stirring over the course of one hour. After dropping was complete, the solution was heat-refluxed for five hours at 50° C. After the solution was cooled to room temperature, toluene was added, mixed, and left to stand. The bottom layer (water layer) was separated, and the toluene solution layer was washed with water three times. The remaining toluene solution layer was concentrated under reduced pressure to obtain a straight-chain organopolysiloxane G2 represented by the following formula (18).

$$HMe_2SiO(Ph_2SiO)_2SiMe_2H \qquad (18)$$

(Straight-Chain Organopolysiloxane G3)

A straight-chain organopolysiloxane G3 represented by the following formula (19) was obtained in the same manner as in the production of the straight-chain organopolysiloxane G1 or G2 with the exception of changing the charged amount of chlorodimethylsilane.

$$HMe_2SiO(Ph_2SiO)_{2.1}SiMe_2H \qquad (19)$$

(Branched-Chain Organopolysiloxane X1)

First, 194.6 g of phenyltrimethoxysilane and 0.22 g of trifluoromethanesulfonic acid were charged into a four-neck flask with a stirrer, a reflux cooling tube, a charging port, and a thermometer and mixed, and 13.3 g of water was dropped into the solution while stirring over the course of 15 minutes. After dropping was complete, the solution was heat-refluxed for one hour. After the solution was cooled to room temperature, 118.6 g of 1,1,3,3-tetramethyldisiloxane was added, and 88.4 g of acetic acid was dropped into the solution while stirring over the course of 30 minutes. After dropping was complete, the solution was heated to 50° C. while stirring and reacted for three hours. After the solution was cooled to room temperature, toluene and water were added, mixed well, and left to stand, and the water layer was separated. After the toluene solution layer was washed with water three times, the solution was concentrated under reduced pressure to obtain a branched-chain organopolysiloxane X1, which is a methylphenylhydrogenoligosiloxane in a liquid state at 25° C. represented by the following average unit formula (11).

$$(HMe_2SiO_{1/2})_{0.6}(PhSiO_{3/2})_{0.4} \qquad (11)$$

<Production of Si-Vi Organopolysiloxanes>
(Branched-Chain Organopolysiloxane B1)

First, 21.4 g of 1,3-divinyl-1,1,3,3-tetramethyldisiloxane, 60 g of water, 0.14 g of trifluoromethanesulfonic acid, and 200 g of toluene were charged into a four-neck flask with a stirrer, a reflux cooling tube, a charging port, and a thermometer and mixed, and 151.5 g of phenyltrimethoxysilane was dropped into the solution while stirring over the course of one hour. After dropping was complete, the solution was heat-refluxed for one hour. After cooling, the bottom layer was separated, and the toluene solution layer was washed with water three times. Next, 100 g of a 5% of sodium hydrogen carbonate aqueous solution was added to the water-washed toluene solution layer, and the solution was heated to 75° C. while stirring and then refluxed for one hour. After cooling, the bottom layer was separated, and the toluene solution layer of the top layer was washed with water three times. The remaining toluene solution layer was concentrated under reduced pressure to obtain a branched-chain organopolysiloxane B1, which is a methylphenylvinylpolysiloxane resin represented by the following average unit formula (12) and is in a semi-solid state at 25°.

$$(ViMe_2SiO_{1/2})_{0.25}(PhSiO_{3/2})_{0.75} \qquad (12)$$

(Straight-Chain Organopolysiloxane Y1)

First, 100 g of a straight-chain organopolysiloxane having a silanol group represented by the following formula (13), 60 g of 1,3-divinyltetramethyldisiloxane, and 0.1 g of trifluoromethanesulfonic acid were charged into a flask with a stirrer and a reflux cooling tube. The solution was stirred and heated for two hours at 70° C., and toluene was then added. After the toluene layer was washed with water three times, the solution was concentrated under reduced pressure to obtain a straight-chain organopolysiloxane Y1 represented by the following formula (14).

$$MO(Ph_2SiO)_5(Me_2SiO)_5H \qquad (13)$$

$$ViMe_2SiO(Ph_2SiO_5(Me_2SiO)_5SiViMe_2 \qquad (14)$$

Working Examples 1 to 8 and Comparative Examples 1 to 2

Production of a Curable Resin Composition

The components shown in Table 1 below were used in the amounts shown in the table (units: parts by mass), and these components were mixed uniformly with a vacuum stirrer to produce a curable resin composition (simply called a "composition" hereafter). In this table, the "Si—H/Si-Vi molar ratio" is as described above.

<Transmittance>

The produced composition was heated and cured for two hours at 150° C. to obtain a cured product (thickness=2.0 mm). The transmittance at a wavelength of 400 nm (units: %) was measured for the resulting cured product in accordance with JIS K 0115:2004 using an ultraviolet-visible (UV-Vis) absorption spectrometer (made by the Shimadzu Corporation). The measurement results are shown in Table 1 below. The composition can be evaluated as having excellent "transparency" when the transmittance value is 80% or higher.

<CF>

After the produced composition was sandwiched between adherends (aluminum alloy plates, A1050P, made by Paltec Co.) with a bonding area of 12.5 mm×25 mm, the composition was cured by heating for two hours at 150° C. to obtain a test sample. A tensile test was performed using the resulting test sample in accordance with JIS K6850:1999, and the ratio of the cohesive failure (CF) area to the bonding area (units: %) was measured. The results are shown in Table 1 below. The composition can be evaluated as having superior adhesion when the CF value is closer to 100.

<Foldability>

The produced composition was heated and cured for two hours at 150° C. to obtain a cured product (thickness=2.0 mm), and the produced cured product was folded 180 degrees. Cases in which no cracks were formed along the folding line and the cured product did not break were evaluated as "○"; cases in which slight cracks were formed along the folding line but the cured product did not break were evaluated as "Δ"; and cases in which cracks were formed along the folding line and the cured product broke were evaluated as "x". For practical purposes, the composition can be evaluated as having excellent foldability when the result is "○" or "Δ".

<Peeling Evaluation>

The produced composition was applied to a LED package (made by Enomoto Co.) and cured by heating for two hours at 150° C. to produce a test sample. Eight test samples were produced for each example. The eight test samples that were produced were used in the following four types of tests, and the number of test samples in which the peeling of the cured product was not observed were counted. The composition can be evaluated as having superior adhesion when this number is larger.

(Reflow Test)

After the test sample is left to stand for 40 seconds on a hot plate heated to 280° C., the presence or absence of the peeling of the cured product was confirmed visually.

(Moisture Resistance Reflow Test 1)

After the test sample was left to stand for 72 hours in an environment with a temperature of 30° C. and 60% humidity, the reflow test described above was performed, and the presence or absence of the peeling of the cured product was confirmed visually.

(Wet Heat Test)

After the test sample was left to stand for 1000 hours in an environment with a temperature of 85° C. and 85% humidity, the presence or absence of the peeling of the cured product was confirmed visually.

(Moisture Resistance Reflow Test 2)

After the test sample was left to stand for 192 hours in an environment with a temperature of 30° C. and 60% humidity, the reflow test described above was performed, and the presence or absence of the peeling of the cured product was confirmed visually.

TABLE 1

|  |  | WORKING EXAMPLES | | | | |
| --- | --- | --- | --- | --- | --- | --- |
|  |  | 1 | 2 | 3 | 4 | 5 |
| Si—H system | Straight-chain organopolysiloxane A1 | 100 |  | 50 | 20 | 20 |
|  | Straight-chain organopolysiloxane A2 |  | 100 |  |  |  |
|  | Straight-chain organopolysiloxane A3 |  |  |  |  |  |
|  | Straight-chain organopolysiloxane G1 |  |  | 40 | 50 | 40 |
|  | Straight-chain organopolysiloxane G2 |  |  |  |  |  |
|  | Straight-chain organopolysiloxane G3 |  |  |  |  |  |
|  | Branched-chain organopolysiloxane X1 |  |  |  |  |  |
| Si-Vi system | Branched-chain organopolysiloxane B1 | 6.5 | 13 | 160 | 160 | 160 |
|  | Straight-chain organopolysiloxane Y1 |  |  |  |  |  |
| Hydrosilylation reaction catalyst C1 |  | 0.1 | 0.1 | 0.1 | 0.1 | 0.1 |
| Low-viscosity organopolysiloxane D1 |  |  |  |  | 20 | 20 |
| Curing retarder E1 |  | 0.1 | 0.1 | 0.1 | 0.1 | 0.1 |
| Adhesion imparting agent F1 |  | 1.0 | 1.0 | 1.0 | 1.0 | 1.0 |
| Si—H/Si-Vi molar ratio |  | 1.0 | 1.0 | 1.0 | 1.0 | 0.8 |
| Transmittance [%] |  | 89.0 | 88.0 | 88.0 | 88.0 | 88.0 |
| CF [%] |  | 100 | 100 | 100 | 100 | 100 |
| Foldability |  | Δ | Δ | ○ | ○ | ○ |
| Peeling Evaluation | Reflow test | 8/8 | 8/8 | 8/8 | 8/8 | 8/8 |
|  | Moisture resistance reflow test 1 | 8/8 | 8/8 | 8/8 | 8/8 | 8/8 |
|  | Wet heat test | 8/8 | 8/8 | 8/8 | 8/8 | 8/8 |
|  | Moisture resistance reflow test 2 | 7/8 | 6/8 | 6/8 | 8/8 | 8/8 |

|  |  | WORKING EXAMPLES | | | COMPARATIVE EXAMPLE | |
| --- | --- | --- | --- | --- | --- | --- |
|  |  | 6 | 7 | 8 | 1 | 2 |
| Si—H system | Straight-chain organopolysiloxane A1 | 100 |  | 50 |  |  |
|  | Straight-chain organopolysiloxane A2 |  | 100 |  |  |  |
|  | Straight-chain organopolysiloxane A3 |  |  |  |  | 25 |
|  | Straight-chain organopolysiloxane G1 | 150 |  |  |  |  |
|  | Straight-chain organopolysiloxane G2 |  |  | 160 |  |  |
|  | Straight-chain organopolysiloxane G3 |  |  |  | 23 |  |
|  | Branched-chain organopolysiloxane X1 |  |  |  |  |  |
| Si-Vi system | Branched-chain organopolysiloxane B1 | 200 | 35 | 200 | 80 | 70 |
|  | Straight-chain organopolysiloxane Y1 |  |  |  | 20 | 30 |
| Hydrosilylation reaction catalyst C1 |  | 0.1 | 0.1 | 0.1 | 0.1 | 0.1 |
| Low-viscosity organopolysiloxane D1 |  | 100 |  | 80 |  |  |
| Curing retarder E1 |  | 0.1 | 0.1 | 0.1 | 0.1 | 0.1 |
| Adhesion imparting agent F1 |  | 1.0 | 1.0 | 1.0 | 1.0 | 1.0 |
| Si—H/Si-Vi molar ratio |  | 1.0 | 1.0 | 1.0 | 1.0 | 1.0 |
| Transmittance [%] |  | 89.0 | 89.0 | 89.0 | 89.0 | 88.0 |
| CF [%] |  | 100 | 100 | 100 | 70 | 80 |
| Foldability |  | ○ | Δ | ○ | x | ○ |
| Peeling Evaluation | Reflow test | 8/8 | 8/8 | 8/8 | 6/8 | 6/8 |
|  | Moisture resistance reflow test 1 | 8/8 | 8/8 | 8/8 | 2/8 | 7/8 |
|  | Wet heat test | 8/8 | 8/8 | 8/8 | 7/8 | 7/8 |
|  | Moisture resistance reflow test 2 | 6/8 | 7/8 | 7/8 | 5/8 | 6/8 |

The components shown in Table 1 are as follows.

<Si—H System>

Straight-chain organopolysiloxane A1: as described above (silicon-bonded hydrogen atom content: 0.01 mass %; content ratio of phenyl groups in all silicon-bonded organic groups: 50 mol %; Mw: 15,000; viscosity: 10,000 mPa s)

Straight-chain organopolysiloxane A2: as described above (silicon-bonded hydrogen atom content: 0.02 mass %; content ratio of phenyl groups in all silicon-bonded organic groups: 49 mol %; Mw: 5,000; viscosity: 3,000 mPas)

Straight-chain organopolysiloxane A3: as described above (silicon-bonded hydrogen atom content: 0.05 mass %; content ratio of phenyl groups in all silicon-bonded organic groups: 48 mol %; Mw: 2,800; viscosity: 1,200 mPas)

Straight-chain organopolysiloxane G1: as described above (silicon-bonded hydrogen atom content: 0.60 mass %; content ratio of phenyl groups in all silicon-bonded organic groups: 33 mol %)

Straight-chain organopolysiloxane G2: as described above (silicon-bonded hydrogen atom content: 0.40 mass %; content ratio of phenyl groups in all silicon-bonded organic groups: 50 mol %)

Straight-chain organopolysiloxane G3: as described above (silicon-bonded hydrogen atom content: 0.35 mass %; content ratio of phenyl groups in all silicon-bonded organic groups: 52 mol %)

Branched-chain organopolysiloxane X1: as described above (silicon-bonded hydrogen atom content: 38 mass %; content ratio of phenyl groups in all silicon-bonded organic groups: 60 mol %; Mw: 4,000; viscosity: 1,200 mPas)

15

<Si-Vi System>

Branched-chain organopolysiloxane B1: as described above (vinyl group content: 4.0 mass %; content ratio of phenyl groups in all silicon-bonded organic groups: 60 mol %; Mw: 1,500; viscosity: the substance was an extremely viscous semi-solid material and the viscosity could not be measured)

Straight-chain organopolysiloxane Y1: as described above (vinyl group content: 4.5 mass %; content ratio of phenyl groups in all silicon-bonded organic groups: 50 mol %; Mw: 900; viscosity: 200 mPas)

Hydrosilylation reaction catalyst C1: platinum divinyltetramethyldisiloxane complex (product name: 3% Pt-VTS-VTS, made by N.E. Chemcat)

Low-viscosity organopolysiloxane D1: organopolysiloxane represented by the following average unit formula (15) (vinyl group content: 8.8%; content ratio of phenyl groups in all silicon-bonded organic groups: 36 mol %; Mw: 1,100; viscosity: 15,000 mPas)

$$(PhSiO_{3/2})_{0.63}(ViMe_2SiO_{1/2})_{0.37} \quad (15)$$

Curing retarder E1: 3-methyl-1-butyne-3-ol (made by Tokyo Kasei Kogyo Co., Ltd.)

Adhesion imparting agent F1: epoxy silane dehydration condensation product formed by performing dehydration condensation on γ-glycidoxypropyl trimethoxysilane (KBM-403 made by Shin-Etsu Chemical Co., Ltd.), phenyltrimethoxysilane (KBM-103 made by Shin-Etsu Chemical Co., Ltd.), and 1,3-divinyl-1,1,3,3-tetramethyldisiloxane When examining the results shown in Table 1, it can be seen from the results of CF and peeling evaluations that Comparative Example 1, which does not contain the Si—H straight-chain organopolysiloxanes A1 to A3, has inferior adhesion.

In addition, even in Comparative Example 2 containing only a straight-chain organopolysiloxane G1, which is a Si—H straight-chain organopolysiloxane but has a degree of polymerization of 1, the adhesion was also inferior.

In contrast, Working Examples 1 to 8, which contain the Si—H straight-chain organopolysiloxanes A1 to A3, all demonstrated excellent adhesion.

In addition, when comparing Working Examples 3 to 5, it can be seen that Working Examples 4 and 5 containing a low-viscosity organopolysiloxane D1 demonstrated better results in the moisture resistance reflow test 2 as well as better adhesion in comparison to Working Example 3, which did not containing the low-viscosity organopolysiloxane D1.

Further, it can be seen that Working Examples 3 to 6 and 8, which contain the straight-chain organopolysiloxanes G1 to G3, demonstrate excellent foldability.

The invention claimed is:

1. A curable resin composition containing:
a straight-chain organopolysiloxane (A) having at least two silicon-bonded hydrogen atoms and at least one aryl group in each molecule, the degree of polymerization being greater than 10;
a branched-chain organopolysiloxane (B) having at least three alkenyl groups and at least one aryl group in each molecule;
a hydrosilylation reaction catalyst (C); and
a straight-chain organopolysiloxane (G) represented by the following formula (16)

$$HR^2{}_2SiO(R^2{}_2SiO)_kSiR^2{}_2H \quad (16)$$

16

In formula (16), each $R^2$ moiety is independently an alkyl group, an aryl group, a hydroxy group (—OH), or an alkoxy group, and at least one of the $R^2$ moieties is an aryl group;
in formula (16), k is a positive number from 1 to 5.

2. The curable resin composition according to claim 1, wherein the degree of polymerization of the straight-chain organopolysiloxane (A) is greater than 30.

3. The curable resin composition according to claim 1, wherein the branched-chain organopolysiloxane (B) is an organopolysiloxane represented by the following average unit formula (4)

$$(R^3SiO_{3/2})_a(R^3{}_2SiO_{2/2})_b(R^3{}_3SiO_{1/2})_c(SiO_{4/2})_d(X^1O_{1/2})_e \quad (4)$$

in formula (4), each $R^3$ moiety is independently a substituted or unsubstituted monovalent hydrocarbon group, however in each molecule, at least three of the $R^3$ moieties are alkenyl groups, and at least one $R^3$ is an aryl group;
in formula (4), $X^1$ is a hydrogen atom or an alkyl group;
in formula (4), a is a positive number; b is 0 or a positive number; c is 0 or a positive number; d is 0 or a positive number; e is 0 or a positive number; b/a is a number within a range of from 0 to 10; c/a is a number within a range of from 0 to 5; d/(a+b+c+d) is a number within a range of from 0 to 0.3; and e/(a+b+c+d) is a number within a range of from 0 to 0.4.

4. The curable resin composition according to claim 1, further containing a low-viscosity organopolysiloxane (D) having a viscosity of at most 50,000 mPa·s at 25° C.

5. The curable resin composition according to claim 1, wherein the composition is a composition for sealing an optical semiconductor element.

6. The curable resin composition according to claim 2, wherein the branched-chain organopolysiloxane (B) is an organopolysiloxane represented by the following average unit formula (4)

$$(R^3SiO_{3/2})_a(R^3{}_2SiO_{2/2})_b(R^3{}_3SiO_{1/2})_c(SiO_{4/2})_d(X^1O_{1/2})_e \quad (4)$$

in formula (4), each $R^3$ moiety is independently a substituted or unsubstituted monovalent hydrocarbon group, however in each molecule, at least three of the $R^3$ moieties are alkenyl groups, and at least one $R^3$ is an aryl group;
in formula (4), $X^1$ is a hydrogen atom or an alkyl group;
in formula (4), a is a positive number; b is 0 or a positive number; c is 0 or a positive number; d is 0 or a positive number; e is 0 or a positive number; b/a is a number within a range of from 0 to 10; c/a is a number within a range of from 0 to 5; d/(a+b+c+d) is a number within a range of from 0 to 0.3; and e/(a+b+c+d) is a number within a range of from 0 to 0.4.

7. The curable resin composition according to claim 2, further containing a low-viscosity organopolysiloxane (D) having a viscosity of at most 50,000 mPa·s at 25° C.

8. The curable resin composition according to claim 3, further containing a low-viscosity organopolysiloxane (D) having a viscosity of at most 50,000 mPa·s at 25° C.

9. The curable resin composition according to claim 6, further containing a low-viscosity organopolysiloxane (D) having a viscosity of at most 50,000 mPa·s at 25° C.

* * * * *